(12) United States Patent
Gupta et al.

(10) Patent No.: US 9,496,236 B2
(45) Date of Patent: Nov. 15, 2016

(54) INTERCONNECT STRUCTURE

(71) Applicant: Tessera, Inc., San Jose, CA (US)

(72) Inventors: Debabrata Gupta, Scottsdale, AZ (US); Yukio Hashimoto, Hitachinaka (JP); Ilyas Mohammed, Santa Clara, CA (US); Laura Wills Mirkarimi, Sunol, CA (US); Rajesh Katkar, San Jose, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 14/501,915

(22) Filed: Sep. 30, 2014

(65) Prior Publication Data

US 2015/0014850 A1    Jan. 15, 2015

Related U.S. Application Data

(62) Division of application No. 12/965,192, filed on Dec. 10, 2010, now Pat. No. 8,853,558.

(51) Int. Cl.
*H05K 1/16* (2006.01)
*H01L 23/00* (2006.01)
(Continued)

(52) U.S. Cl.
CPC .......... *H01L 24/14* (2013.01); *H01L 23/49811* (2013.01); *H01L 23/528* (2013.01); *H01L 25/105* (2013.01); *H01L 23/49833* (2013.01);
(Continued)

(58) Field of Classification Search
CPC ............. H01L 24/14; H01L 23/49811; H01L 25/105; H01L 23/528; H01L 23/49833; H01L 24/81; H01L 2224/81193; H01L 2224/81801

USPC ........................................................ 174/260
See application file for complete search history.

(56) References Cited

U.S. PATENT DOCUMENTS 3,214,827 A    11/1965    Phohofsky
3,766,439 A    10/1973    Isaacson
(Continued)

FOREIGN PATENT DOCUMENTS

CN          1244037        2/2000
DE    102006006825 A1      8/2007
(Continued)

OTHER PUBLICATIONS

U.S. Appl. No. 12/965,172, filed Dec. 10, 2010.
(Continued)

*Primary Examiner* — Tremesha S Willis
(74) *Attorney, Agent, or Firm* — Lerner, David, Littenberg, Krumholz & Mentlik, LLP

(57) ABSTRACT

A microelectronic assembly includes first and second surfaces, a first thin conductive element, a first conductive projection, and a first fusible mass. The first thin conductive element includes a face that has first and second regions. The first conductive projection covers the first region of the first face. A barrier may be formed along a portion of the first region. The second face includes a second conductive projection that extends away therefrom. The first fusible metal mass connects the first conductive projection to the second conductive projection such that the first surface of the first face is oriented toward the second surface of the second substrate. The first mass extends along a portion of the first conductive projection to a location toward the first edge of the barrier. The barrier is disposed between the first thin element and the first metal mass.

17 Claims, 6 Drawing Sheets

(51) Int. Cl.
*H01L 23/498* (2006.01)
*H01L 25/10* (2006.01)
*H01L 23/528* (2006.01)

(52) U.S. Cl.
CPC .............. *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 2224/131* (2013.01); *H01L 2224/13014* (2013.01); *H01L 2224/13017* (2013.01); *H01L 2224/13147* (2013.01); *H01L 2224/13647* (2013.01); *H01L 2224/16225* (2013.01); *H01L 2224/16227* (2013.01); *H01L 2224/32225* (2013.01); *H01L 2224/48227* (2013.01); *H01L 2224/73265* (2013.01); *H01L 2224/81193* (2013.01); *H01L 2224/81801* (2013.01); *H01L 2225/0652* (2013.01); *H01L 2225/06517* (2013.01); *H01L 2225/1023* (2013.01); *H01L 2225/1058* (2013.01); *H01L 2924/15311* (2013.01); *H01L 2924/15321* (2013.01); *H01L 2924/15331* (2013.01)

(56) References Cited

U.S. PATENT DOCUMENTS

| | | |
|---|---|---|
| 3,775,844 A | 12/1973 | Parks |
| 3,873,889 A | 3/1975 | Leyba |
| 4,225,900 A | 9/1980 | Ciccio et al. |
| 4,567,543 A | 1/1986 | Miniet |
| 4,576,543 A | 3/1986 | Kuchyt et al. |
| 4,695,870 A | 9/1987 | Patraw |
| 4,716,049 A | 12/1987 | Patraw |
| 4,781,601 A | 11/1988 | Kuhl et al. |
| 4,804,132 A | 2/1989 | DiFrancesco |
| 4,902,600 A | 2/1990 | Tamagawa et al. |
| 4,924,353 A | 5/1990 | Patraw |
| 4,941,033 A | 7/1990 | Kishida |
| 4,975,079 A | 12/1990 | Beaman et al. |
| 4,982,265 A | 1/1991 | Watanabe et al. |
| 4,991,290 A | 2/1991 | MacKay |
| 5,046,238 A | 9/1991 | Daigle et al. |
| 5,068,714 A | 11/1991 | Seipler |
| 5,083,697 A | 1/1992 | Difrancesco |
| 5,116,456 A | 5/1992 | Nestor |
| 5,116,459 A | 5/1992 | Kordus et al. |
| 5,117,282 A | 5/1992 | Salatino |
| 5,130,779 A | 7/1992 | Agarwala et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,189,505 A | 2/1993 | Bartelink |
| 5,196,726 A | 3/1993 | Nishiguchi et al. |
| 5,198,888 A | 3/1993 | Sugano et al. |
| 5,214,308 A | 5/1993 | Nishiguchi et al. |
| 5,220,448 A | 6/1993 | Vogel et al. |
| 5,220,488 A | 6/1993 | Denes |
| 5,222,014 A | 6/1993 | Lin |
| 5,224,023 A | 6/1993 | Smith et al. |
| 5,247,423 A | 9/1993 | Lin et al. |
| 5,251,806 A | 10/1993 | Agarwala et al. |
| 5,281,852 A | 1/1994 | Normington |
| 5,313,416 A | 5/1994 | Kimura |
| 5,324,892 A | 6/1994 | Granier et al. |
| 5,334,804 A | 8/1994 | Love et al. |
| 5,334,875 A | 8/1994 | Sugano et al. |
| 5,345,205 A | 9/1994 | Kornrumpf |
| 5,347,159 A | 9/1994 | Khandros et al. |
| 5,390,844 A | 2/1995 | Distefano et al. |
| 5,394,303 A | 2/1995 | Yamaji |
| 5,397,916 A | 3/1995 | Normington |
| 5,397,997 A | 3/1995 | Tuckerman et al. |
| 5,398,863 A | 3/1995 | Grube et al. |
| 5,409,865 A | 4/1995 | Karnezos |
| 5,422,435 A | 6/1995 | Takiar et al. |
| 5,426,563 A | 6/1995 | Moresco et al. |
| 5,440,171 A | 8/1995 | Miyano et al. |
| 5,448,511 A | 9/1995 | Paurus et al. |
| 5,454,160 A | 10/1995 | Nickel |
| 5,455,390 A | 10/1995 | DiStefano et al. |
| 5,455,740 A | 10/1995 | Burns |
| 5,457,879 A | 10/1995 | Gurtler et al. |
| 5,466,635 A | 11/1995 | Lynch et al. |
| 5,479,318 A | 12/1995 | Burns |
| 5,489,749 A | 2/1996 | DiStefano |
| 5,491,302 A | 2/1996 | Distefano et al. |
| 5,518,964 A | 5/1996 | DiStefano et al. |
| 5,536,909 A | 7/1996 | DiStefano et al. |
| 5,539,153 A | 7/1996 | Schwiebert et al. |
| 5,541,525 A | 7/1996 | Wood et al. |
| 5,552,963 A | 9/1996 | Burns |
| 5,587,342 A | 12/1996 | Lin et al. |
| 5,615,824 A | 4/1997 | Fjelstad et al. |
| 5,640,052 A | 6/1997 | Tsukamoto |
| 5,646,446 A | 7/1997 | Nicewarner, Jr. et al. |
| 5,656,550 A | 8/1997 | Tsuji et al. |
| 5,659,952 A | 8/1997 | Kovac et al. |
| 5,679,977 A | 10/1997 | Khandros et al. |
| 5,689,091 A | 11/1997 | Hamzehdoost et al. |
| 5,717,556 A | 2/1998 | Yanagida |
| 5,731,709 A | 3/1998 | Pastore et al. |
| 5,739,585 A | 4/1998 | Akram et al. |
| 5,762,845 A | 6/1998 | Crumly |
| 5,776,797 A | 7/1998 | Nicewarner, Jr. et al. |
| 5,777,386 A | 7/1998 | Higashi et al. |
| 5,786,271 A | 7/1998 | Ohida et al. |
| 5,789,279 A | 8/1998 | Crema |
| 5,789,815 A | 8/1998 | Tessier et al. |
| 5,798,286 A | 8/1998 | Faraci et al. |
| 5,802,699 A | 9/1998 | Fjelstad et al. |
| 5,805,422 A | 9/1998 | Otake et al. |
| 5,811,982 A | 9/1998 | Beaman et al. |
| 5,854,507 A | 12/1998 | Miremadi et al. |
| 5,861,666 A | 1/1999 | Bellaar |
| 5,956,234 A | 9/1999 | Mueller |
| 5,973,391 A | 10/1999 | Bischoff et al. |
| 5,980,270 A | 11/1999 | Fjelstad et al. |
| 5,985,692 A | 11/1999 | Poenisch et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,061,245 A | 5/2000 | Ingraham et al. |
| 6,157,075 A | 12/2000 | Karavakis et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,216,941 B1 | 4/2001 | Yokoyama et al. |
| 6,217,972 B1 | 4/2001 | Beroz et al. |
| 6,218,302 B1 | 4/2001 | Braeckelmann et al. |
| 6,229,220 B1 | 5/2001 | Saitoh et al. |
| 6,235,996 B1 | 5/2001 | Farooq et al. |
| 6,258,625 B1 | 7/2001 | Brofman et al. |
| 6,300,679 B1 | 10/2001 | Mukerji et al. |
| 6,307,260 B1 | 10/2001 | Smith et al. |
| 6,322,903 B1 | 11/2001 | Siniaguine et al. |
| 6,329,594 B1 | 12/2001 | Sturcken |
| 6,332,270 B2 | 12/2001 | Beaman et al. |
| 6,335,571 B1 | 1/2002 | Capote et al. |
| 6,358,627 B2 | 3/2002 | Benenati et al. |
| 6,362,525 B1 | 3/2002 | Rahim |
| 6,455,785 B1 | 9/2002 | Sakurai et al. |
| 6,458,411 B1 | 10/2002 | Goossen et al. |
| 6,469,394 B1 | 10/2002 | Wong et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto |
| 6,550,666 B2 | 4/2003 | Chew et al. |
| 6,555,918 B2 | 4/2003 | Masuda et al. |

(56) References Cited

U.S. PATENT DOCUMENTS

| | | |
|---|---|---|
| 6,560,117 B2 | 5/2003 | Moon |
| 6,578,754 B1 | 6/2003 | Tung |
| 6,589,870 B1 | 7/2003 | Katoh et al. |
| 6,592,109 B2 | 7/2003 | Yamaguchi et al. |
| 6,624,653 B1 | 9/2003 | Cram |
| 6,647,310 B1 | 11/2003 | Yi et al. |
| 6,648,213 B1 | 11/2003 | Patterson et al. |
| 6,664,637 B2 | 12/2003 | Jimarez et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Iijima et al. |
| 6,815,252 B2 | 11/2004 | Pendse |
| 6,822,336 B2 | 11/2004 | Kurita |
| 6,852,564 B2 | 2/2005 | Ohuchi et al. |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,888,255 B2 | 5/2005 | Murtuza et al. |
| 6,902,869 B2 | 6/2005 | Appelt et al. |
| 6,906,418 B2 | 6/2005 | Hiatt et al. |
| 6,956,165 B1 | 10/2005 | Hata et al. |
| 6,965,166 B2 | 11/2005 | Hikita et al. |
| 6,992,379 B2 | 1/2006 | Alcoe et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,115,495 B2 | 10/2006 | Wark et al. |
| 7,125,789 B2 | 10/2006 | Tellkamp et al. |
| 7,176,043 B2 | 2/2007 | Haba et al. |
| 7,183,190 B2 | 2/2007 | Saijo et al. |
| 7,214,887 B2 | 5/2007 | Higashida et al. |
| 7,361,285 B2 | 4/2008 | Kim |
| 7,382,049 B2 | 6/2008 | Ho et al. |
| 7,569,935 B1 | 8/2009 | Fan |
| 7,598,613 B2 | 10/2009 | Tanida et al. |
| 7,745,943 B2 | 6/2010 | Haba et al. |
| 7,829,265 B2 | 11/2010 | Kitada et al. |
| 7,901,989 B2 | 3/2011 | Haba et al. |
| 7,911,805 B2 | 3/2011 | Haba |
| 8,115,310 B2 | 2/2012 | Masumoto et al. |
| 8,330,272 B2 | 12/2012 | Haba |
| 2001/0008309 A1 | 7/2001 | Iijima et al. |
| 2001/0030061 A1 | 10/2001 | Yoneda |
| 2002/0033412 A1 | 3/2002 | Tung |
| 2002/0056906 A1 | 5/2002 | Kajiwara et al. |
| 2002/0074641 A1 | 6/2002 | Towle et al. |
| 2002/0090756 A1 | 7/2002 | Tago et al. |
| 2002/0125571 A1 | 9/2002 | Corisis et al. |
| 2002/0153602 A1 | 10/2002 | Tay et al. |
| 2002/0155661 A1 | 10/2002 | Massingill et al. |
| 2002/0185735 A1 | 12/2002 | Sakurai et al. |
| 2002/0190107 A1 | 12/2002 | Shah et al. |
| 2003/0001286 A1 | 1/2003 | Kajiwara et al. |
| 2003/0019568 A1 | 1/2003 | Liu et al. |
| 2003/0075791 A1 | 4/2003 | Shibata |
| 2003/0082846 A1 | 5/2003 | Yoneda et al. |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |
| 2003/0164540 A1 | 9/2003 | Lee et al. |
| 2003/0189260 A1 | 10/2003 | Tong et al. |
| 2003/0234453 A1 | 12/2003 | Liu et al. |
| 2004/0031972 A1 | 2/2004 | Pflughaupt et al. |
| 2004/0087057 A1 | 5/2004 | Wang et al. |
| 2004/0126927 A1 | 7/2004 | Lin et al. |
| 2004/0132533 A1 | 7/2004 | Leifer |
| 2004/0135243 A1 | 7/2004 | Aoyagi |
| 2004/0155358 A1 | 8/2004 | Iijima |
| 2004/0201096 A1 | 10/2004 | Iijima et al. |
| 2004/0232533 A1 | 11/2004 | Hatakeyama |
| 2004/0238936 A1 | 12/2004 | Rumer et al. |
| 2004/0245213 A1 | 12/2004 | Fukase et al. |
| 2004/0262778 A1 | 12/2004 | Hua |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0150684 A1 | 7/2005 | Hashimoto |
| 2005/0194695 A1 | 9/2005 | Lin et al. |
| 2005/0284658 A1 | 12/2005 | Kubota et al. |
| 2005/0285246 A1 | 12/2005 | Haba et al. |
| 2006/0091538 A1 | 5/2006 | Kabadi |
| 2006/0138647 A1 | 6/2006 | Crisp et al. |
| 2006/0220259 A1 | 10/2006 | Chen et al. |
| 2007/0017090 A1 | 1/2007 | Sakai et al. |
| 2007/0045869 A1 | 3/2007 | Ho et al. |
| 2007/0141750 A1 | 6/2007 | Iwasaki et al. |
| 2007/0164447 A1 | 7/2007 | Ho et al. |
| 2007/0209199 A1 | 9/2007 | Iijima et al. |
| 2007/0230153 A1 | 10/2007 | Tanida et al. |
| 2008/0003402 A1 | 1/2008 | Haba et al. |
| 2008/0067661 A1 | 3/2008 | Kawabata |
| 2009/0002964 A1 | 1/2009 | Haba |
| 2009/0039507 A1 | 2/2009 | Funaki |
| 2009/0039528 A1 | 2/2009 | Haba et al. |
| 2009/0071707 A1 | 3/2009 | Endo et al. |
| 2009/0091024 A1 | 4/2009 | Zeng et al. |
| 2009/0115047 A1 | 5/2009 | Haba et al. |
| 2009/0121348 A1 | 5/2009 | Chang |
| 2009/0146303 A1 | 6/2009 | Kwon |
| 2009/0148594 A1 | 6/2009 | Moran et al. |
| 2009/0188706 A1 | 7/2009 | Endo |
| 2009/0243095 A1 | 10/2009 | Fujita et al. |
| 2009/0302466 A1 | 12/2009 | Shoji et al. |
| 2010/0044860 A1 | 2/2010 | Haba et al. |
| 2011/0074027 A1 | 3/2011 | Kwon |
| 2013/0099376 A1 | 4/2013 | Haba |

FOREIGN PATENT DOCUMENTS

| | | |
|---|---|---|
| EP | 0615283 A1 | 9/1994 |
| EP | 1091406 A2 | 4/2001 |
| EP | 1255295 A1 | 11/2002 |
| EP | 1387402 A2 | 2/2004 |
| EP | 1471570 A1 | 10/2004 |
| EP | 1602749 | 12/2005 |
| JP | 54148484 | 11/1979 |
| JP | 57107501 | 7/1982 |
| JP | 62117346 A | 5/1987 |
| JP | 63153889 | 6/1988 |
| JP | 64086527 | 3/1989 |
| JP | H04151843 A | 5/1992 |
| JP | 06268015 A | 9/1994 |
| JP | 7211722 A | 8/1995 |
| JP | 08031835 | 2/1996 |
| JP | 10013003 | 1/1998 |
| JP | H10125734 A | 5/1998 |
| JP | 11087556 | 3/1999 |
| JP | 11097576 A | 4/1999 |
| JP | 11111886 | 4/1999 |
| JP | 2000100869 A | 4/2000 |
| JP | 2000277649 A | 10/2000 |
| JP | 2001118872 A | 4/2001 |
| JP | 2001244365 A | 9/2001 |
| JP | 2002016096 A | 1/2002 |
| JP | 2002043506 A | 2/2002 |
| JP | 2002124548 A | 4/2002 |
| JP | 2002261204 A | 9/2002 |
| JP | 2002313993 A | 10/2002 |
| JP | 2002313996 A | 10/2002 |
| JP | 2002359471 A | 12/2002 |
| JP | 2003007768 A | 1/2003 |
| JP | 2003037135 A | 2/2003 |
| JP | 2003051665 A | 2/2003 |
| JP | 2003092472 A | 3/2003 |
| JP | 2003124250 A | 4/2003 |
| JP | 2004128230 A | 4/2004 |
| JP | 2004221450 A | 8/2004 |
| JP | 2004273957 A | 9/2004 |
| JP | 2004342802 A | 12/2004 |
| JP | 2004349390 A | 12/2004 |

(56) References Cited

FOREIGN PATENT DOCUMENTS

| | | | |
|---|---|---|---|
| JP | 2005026645 A | 1/2005 | |
| JP | 2005032964 A | 2/2005 | |
| JP | 2005045191 A | 2/2005 | |
| JP | 2005093512 A | 4/2005 | |
| JP | 2005123547 A | 5/2005 | |
| JP | 2005216696 A | 8/2005 | |
| JP | 2005243761 A | 9/2005 | |
| JP | 2005285986 A | 10/2005 | |
| JP | 2006005322 A | 1/2006 | |
| JP | 2007023338 A | 2/2007 | |
| JP | 2007129207 A | 5/2007 | |
| JP | 2007242900 A | 9/2007 | |
| JP | 2007266555 A | 10/2007 | |
| JP | 2009177118 A | 8/2009 | |
| JP | 2010521587 A | 6/2010 | |
| WO | 0141207 A1 | 6/2001 | |
| WO | 2005122706 A2 | 12/2005 | |
| WO | 2006004672 A1 | 1/2006 | |
| WO | 2006057097 A1 | 6/2006 | |
| WO | 2008000020 A1 | 1/2008 | |
| WO | 2008076428 A1 | 6/2008 | |
| WO | 2008112318 A2 | 9/2008 | |
| WO | 2009/020572 A2 | 2/2009 | |
| WO | 2009017758 A2 | 2/2009 | |
| WO | 2009023283 A2 | 2/2009 | |
| WO | 2009023284 A2 | 2/2009 | |
| WO | 2009045371 A2 | 4/2009 | |

OTHER PUBLICATIONS

U.S. Appl. No. 60/508,970, filed Oct. 6, 2003.
U.S. Appl. No. 60/533,393, filed Dec. 30, 2003.
U.S. Appl. No. 60/633,210, filed Dec. 30, 2003.
Yamada H et al., "A fine pitch and high aspect ratio bump array for flip-chip interconnection", Proceedings of the International Electronic Manufacturing Technology Symposium, Baltimore, USA, Sep. 28-30, 1992, New York, USA, IEEE, vol. SYMP. 13, Sep. 28, 1992, pp. 288-292, XP010259441.
Yamada H et al., "A fine pitch and high aspect ratio bump fabrication process for flip-chip interconnection", Proceedings of the Electronic Manufacturing Technology Symposium, Omiya, Japan, Dec. 4-6, 1995, New York, USA, IEEE, Dec. 4, 1995, pp. 121-124, XP010195564.
Amendment Accompanying RCE dated Mar. 13, 2013, filed in U.S. Appl. No. 12/462,208.
Amendment Submitted with RCE dated Feb. 24, 2014, filed in U.S. Appl. No. 12/462,208.
Amendment to Final Office Action dated Feb. 27, 2013, filed in U.S. Appl. No. 12/965,172.
Amendment to Non Final Office Action dated Mar. 4, 2014 filed for U.S. Appl. No. 13/795,473.
Amendment to Non-Final Office Action dated Dec. 10, 2013, filed in U.S. Appl. No. 12/965,172.
Amendment to Non-Final Office Action dated May 16, 2012, filed in U.S. Appl. No. 12/317,707.
Amendment to Non-Final Office Action dated May 21, 2012, filed in U.S. Appl. No. 12/462,208.
Amendment to Non-Final Office Action dated Jul. 30, 2012, filed in U.S. Appl. No. 12/965,172.
Amendment to Non-Final Office Action dated Aug. 8, 2013, filed in U.S. Appl. No. 12/462,208.
Chinese Office Action for Application No. 200880011888.1 dated Feb. 18, 2014.
Chinese Office Action for Application No. 200880117714.3 dated Jan. 29, 2013.
Chinese Office Action for Application No. 200880117714.3 dated Jul. 18, 2012.
Chinese Office Action for Application No. 200980141969.8 dated Jan. 28, 2013.
Choubey A; Hao Yu; Osterman M; Pecht M; Fu Yun; Li Yonghong; Xu Ming: "Intermetallics Characterization of lead-free solder joints under isothermal aging" Journal of Electronic Materials, vol. 37, No. 8, May 28, 2008, pp. 1130-1138, XP002555807.
Co-Pending U.S. Appl. No. 11/166,982, Amendment dated Jun. 23, 2008.
Co-Pending U.S. Appl. No. 11/166,982, Non-final Rejection dated Mar. 21, 2008.
Co-Pending U.S. Appl. No. 11/717,587, US Final Office Action dated Mar. 16, 2011.
Co-Pending U.S. Appl. No. 11/717,587, Amendment dated Sep. 16, 2011.
EP Report for Application No. 11740758.5 dated Nov. 27, 2013.
Extended European Search Report for Application No. 13164353.8 dated Feb. 7, 2014.
Extended European Search Report for Application No. EP 08835829.6 dated Feb. 28, 2012.
Final Office Action dated Aug. 27, 2012, filed in U.S. Appl. No. 12/965,172.
Korean Office Action for Application No. 10-2011-7006476 dated May 30, 2012.
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
Non Final Office Action dated Dec. 5, 2013 filed for U.S. Appl. No. 13/795,473.
Non-Final Office Action dated Dec. 16, 2011, filed in U.S. Appl. No. 12/317,707.
Non-Final Office Action dated Dec. 21, 2011, filed in U.S. Appl. No. 12/462,208.
Non-Final Office Action dated Feb. 29, 2012, filed in U.S. Appl. No. 12/965,172.
Non-Final Office Action dated Mar. 28, 2014, filed in U.S. Appl. No. 12/462,208.
Non-Final Office Action dated Apr. 8, 2013, filed in U.S. Appl. No. 12/462,208.
Non-Final Office Action dated Jul. 10, 2013, filed in U.S. Appl. No. 12/965,172.
North Corporation, "Processed Intra-layer Interconnection Material for PWBs [Etched Copper Bump with Copper Foil]," NMBITM, Version 2001.6.
Office Action for Chinese Application No. 200980141969.8 dated Dec. 18, 2013.
Office Action from Japanese Application No. 2007-518347 dated Feb. 1, 2011.
Office Action from Taiwan Application No. 100124338 dated Dec. 6, 2013.
Partial European Search Report for Application No. EP13164353 dated Aug. 7, 2013.
Printout from Merriam-Webster, Definition of Pad, printed on Feb. 25, 2013.
Supplemental Amendment dated Jan. 7, 2014, filed in U.S. Appl. No. 12/965,172.
Supplementary Partial European Search Report for Application No. EP 08835829 dated Feb. 21, 2012.
Amendment to Non-Final Office Action dated May 2, 2014, filed in U.S. Appl. No. 12/965,192.
European Office Action for Application No. 08835829.6 dated Oct. 19, 2012.
Japanese Office Action for Application No. 2007-332727 dated Oct. 30, 2012.
JP Office Action for Application No. JP2009-553652 dated Nov. 11, 2014.
Non-Final Office Action dated Mar. 21, 2014, filed in U.S. Appl. No. 12/965,192.
Taiwanese Office Action for Application No. 100145661 dated Sep. 25, 2014.
U.S. Appl. No. 12/965,192, filed Dec. 10, 2010.
U.S. Appl. No. 60/875,730, filed Dec. 19, 2006.
U.S. Appl. No. 60/936,617, filed Jun. 20, 2007.
U.S. Appl. No. 60/962,200, filed Jul. 27, 2007.
U.S. Appl. No. 60/963,209, filed Aug. 3, 2007.
U.S. Appl. No. 60/964,069, filed Aug. 9, 2007.
U.S. Appl. No. 60/964,823, filed Aug. 15, 2007.

(56) References Cited

OTHER PUBLICATIONS

U.S. Appl. No. 60/964,916, filed Aug. 15, 2007.
Final Office Action dated Mar. 28, 2014 filed for U.S. Appl. No. 13/795,473.
Final Rejection dated Nov. 22, 2013, filed in U.S. Appl. No. 12/462,208.
Final Rejection dated Sep. 13, 2012, filed in U.S. Appl. No. 12/462,208.
International Search Report and Written Opinion for Application No. PCT/US2011/043152, dated Dec. 9, 2011.
International Search Report and Written Opinion, PCT/US2009/004694, mailed Dec. 7, 2009.
International Search Report for Application No. PCT/US2011/063953 dated Mar. 29, 2012.
International Search Report, PCT/US2008/011271, dated Mar. 27, 2009.
International Search Report, PCT/US2008/03473 dated Sep. 15, 2008.
Japanese Office Action for Application No. 2007-518347 dated Nov. 2, 2012.
Japanese Office Action for Application No. 2010-526972 dated Apr. 8, 2014.
Japanese Office Action for Application No. 2010-526972 dated Jan. 25, 2013.

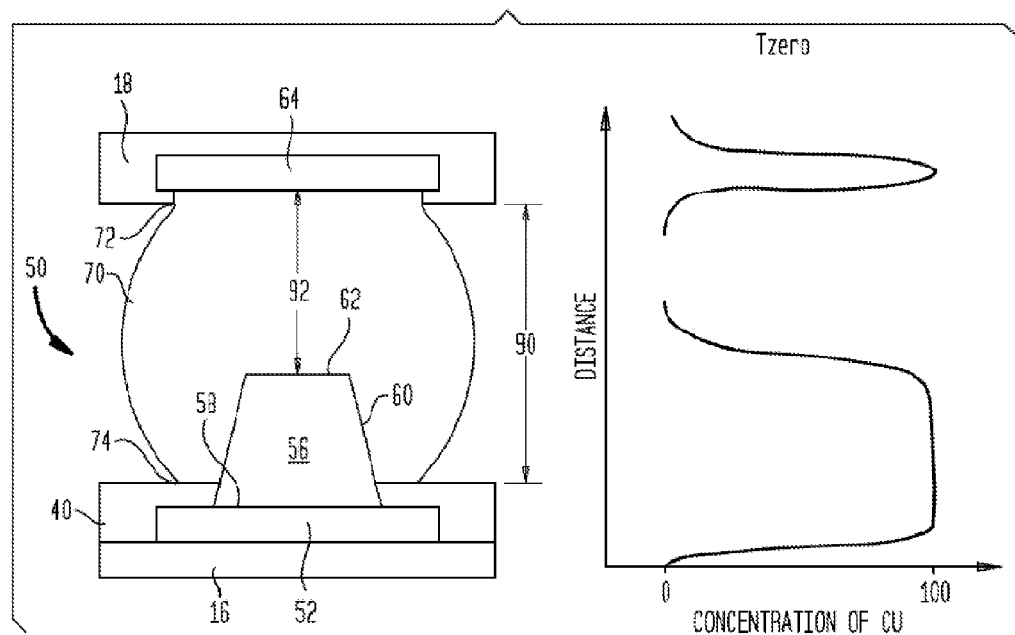
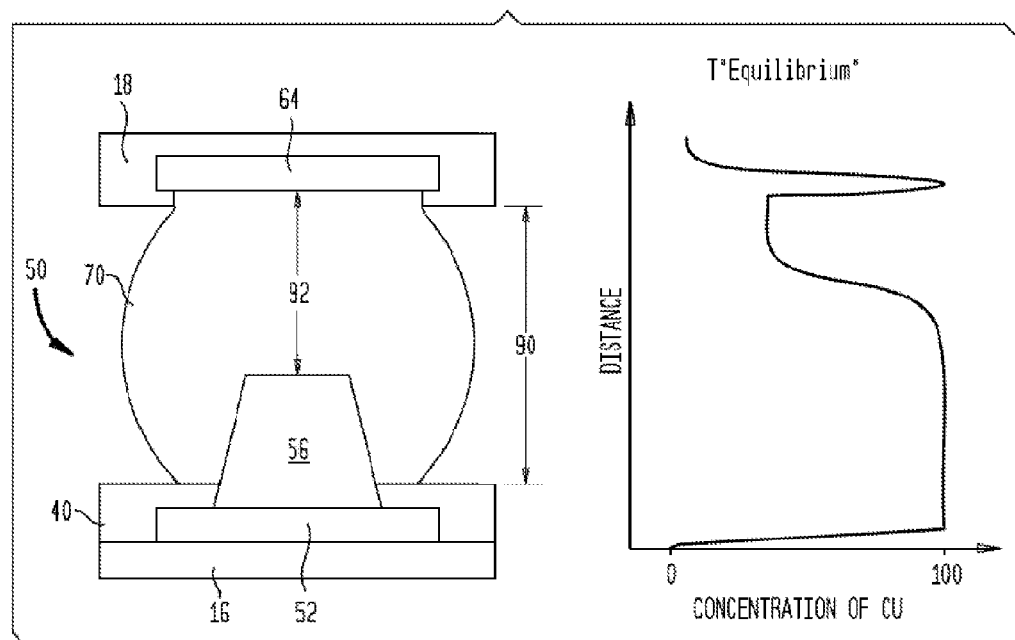

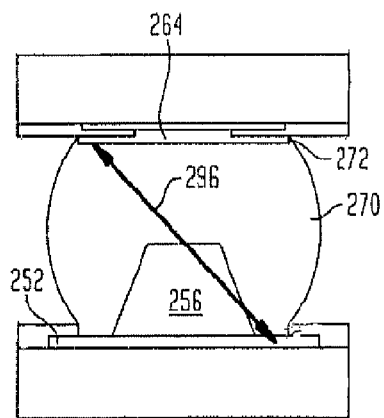
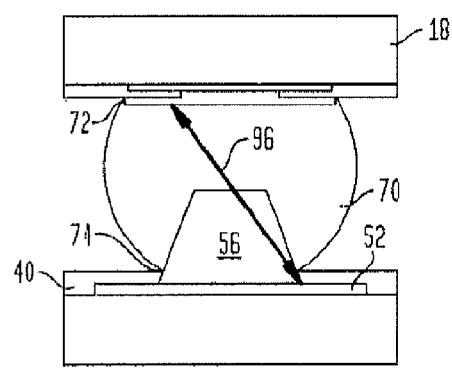
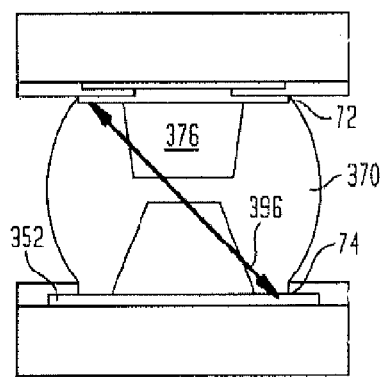
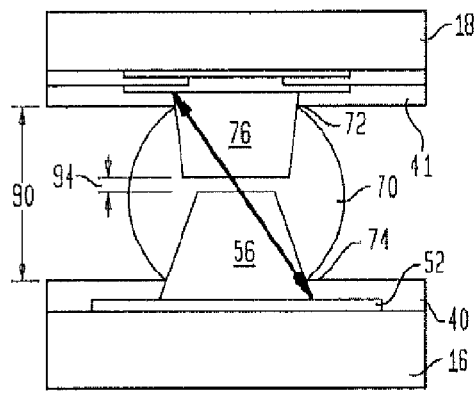

INTERCONNECT STRUCTURE

CROSS-REFERENCE TO RELATED APPLICATIONS

This application is a divisional of U.S. application Ser. No. 12/965,192, filed on Dec. 10, 2010, the disclosure of which is incorporated herein by reference.

BACKGROUND OF THE INVENTION

The present disclosure relates to interconnect structures used in packaged microelectronic assemblies. In particular it relates to interconnect structures used in the connection of microelectronic chips and dies to substrates, such as in flip-chip bonding, or between substrates, such as in the formation of stacked packages. The structures described herein can be used to reduce failure of interconnect bonds due to void formation caused by electromigration between components of prior structures.

Electromigration is a main cause of interconnect failure, especially in high-performance devices where the current density in the interconnect and the device operating temperatures are high. In general, electromigration is caused by the different diffusion rates of materials used in interconnect assemblies. For example, an interconnect assembly can include a contact pad made of copper formed on each of two substrates and a solder mass bonded between the contact pads. The solder mechanically secures the two contact pads, and thus, the substrates on which they are formed, and also electronically connects the two pads so that a signal carried by an electric current can pass between the two pads through the solder mass. In this example, the diffusion rates between the solder and the copper of the pads can be different. The diffusion rates are the rates of molecular movement within the metallic structures over time, and in particular, when subjected to a current or to the heat caused by operation of the devices.

Voids formed in interconnect structures can decrease the reliability of the microelectronic assemblies in which they are used. Further, the presence of voids increases the current density within the materials in the areas surrounding the voids. This can, in turn, further exacerbate the difference in diffusion rate, leading to acceleration of void formation, leading eventually, to both electrical and mechanical failure of the interconnect element.

Present means of decreasing electromigration include using barrier metals or dopants in the solder. These means, however, present their own reliability issues and can lead to cost increases that outweigh their effectiveness. Accordingly, further means for reducing electromigration are needed.

BRIEF SUMMARY OF THE INVENTION

An embodiment of the present invention relates to a microelectronic assembly. The microelectronic assembly includes a first surface and a first thin conductive element exposed at the first surface and having a face comprising first and second regions. A first conductive projection having a base connected to and covering the first region of the face extends to an end remote from the base. A first dielectric material layer covers the second region of the first thin element and contacts at least the base of the first conductive projection. The assembly further includes a second substrate having a second face and a second conductive projection extending away from the second face. A first fusible metal mass connects the first projection to the second projection such that the first surface of the first face is oriented toward the second surface. The first mass extends along an edge of the first projection towards the first dielectric material layer. In a further embodiment, the first fusible metal mass can contact the first dielectric material layer.

The microelectronic assembly can be configured such that the first surface is formed on a substrate and the second surface is formed on a microelectronic element. Additionally or alternatively, the first surface can be formed on a substrate further having a microelectronic element affixed thereon, and the second surface can be formed on a second substrate. In a further embodiment, the microelectronic assembly includes a plurality of interconnect structures each including a first conductive element, a first conductive projections, a second conductive projection, and a first metal mass. Each interconnect structure is connected between the first region of the first face and the second face and has a structure similar to that described above wherein the first dielectric material layer covers the second regions of the thin elements.

The first opening in the first dielectric material layer can define an inside surface such that the inside surface extends along a portion of the first projection in substantial contact therewith. Accordingly, the first dielectric material layer can have a thickness extending in a direction perpendicular to the first face of the first thin element. The thickness can be about 20% to 50% of a height of the first conductive projection.

The base of the first conductive projection can have a periphery such that the second region of the first face is exposed outside of the periphery of the base of the first projection. This arrangement can further form a corner between the first face of the first thin element and the side wall of the first conductive element. The corner can be located along the outer periphery of the base of the first conductive element, and the first dielectric material layer can substantially cover the corner.

In a further embodiment, a second thin conductive element can be exposed on the second surface and can have a second face consisting of first and second regions. The second projection can further have a base that is connected to and covers the first region of the second thin element and defines a periphery and an end portion remote from the base. A second dielectric material layer can cover the second region of the second thin element. Further, the first mass can extend over a portion of the second conductive projection toward the second dielectric material layer.

A further embodiment of the present invention relates to a microelectronic assembly that includes a first surface and a first thin conductive element that is exposed on the first surface and has a face consisting of first and second regions. A first conductive projection is connected to and covers the first region of the first face and extends to an end remote therefrom. The conductive projection has a barrier formed along a portion thereof that has a first edge remote from the first thin conductive element. The assembly further includes a second face having a second conductive projection extending away therefrom. A first fusible metal mass connects the first conductive projection to the second conductive projection such that the first surface of the first face is oriented toward the second surface of the second substrate. The first mass extends along a portion of the first conductive projection to a location toward the first edge of the barrier, the barrier being disposed between the first thin element and the first metal mass. The barrier can be a surface-treatment layer formed in the first conductive projection. The surface-treatment layer can be formed by oxidation or can be a coating applied on a surface of the first conductive projection.

In a still further embodiment, the microelectronic assembly includes a first substrate having a first surface and a first thin conductive element exposed on the first surface and having a first face. A first conductive projection having a base connected to the first face extends to an end remote from the first face and defines a side wall between the base and the end. A dielectric material layer extends along the first surface of the first substrate and has a second surface and a third surface remote from the second surface. The dielectric material layer further has a first opening defining a periphery formed therein. A metal plating layer having a first portion extends along the end and at least a portion of the side wall of the first conductive projection. A second portion of the metal plating layer extends outwardly along a portion of the dielectric material layer and away from the first conductive projection. A first solder mass is formed over at least the first portion of the plating layer and extends toward the third surface.

A still further embodiment relates to microelectronic assembly including a substrate having a first surface, a plurality of first conductive pads exposed on the first surface and defining a face, and a plurality of first metal posts. Each metal post defines a base having an outer periphery and is connected to a respective one of the first conductive pads. Each metal post extends along a side wall from the base to ends remote from the first conductive pad. The assembly further includes a dielectric material layer having an inner surface, an outer surface, and a plurality of openings. The inner surface extends along the first surface of the substrate, the outer surface being remote from the substrate. Respective ones of the first metal posts project through the openings such that the dielectric material layer contacts at least the outside peripheries of the first metal posts. A plurality of fusible metal masses contact the ends of at least some of first metal posts and extend along side walls of the first metal posts towards the outer surface of the dielectric material layer. A microelectronic element is carried on the substrate and is electronically connected to at least some of the first conductive pads.

A still further embodiment relates to a microelectronic assembly including a first substrate having a first surface and a first thin conductive element having a first face and being exposed on the first surface. A first conductive projection having a base is connected to the first face and extends to an end remote from the first face. A side wall is defined between the base and the end. The assembly further includes a dielectric material layer having a second surface and a third surface remote from the second surface. The second surface extends along the first surface of the first substrate, and the dielectric material layer has a first opening with a periphery formed therein. A first solder mass is formed on the first conductive projection that extends along the end and a portion of the side wall to a location disposed between the base and the end. The first conductive projection extends through the first opening such that the periphery thereof contacts a portion of the side wall. The solder mass extends towards the third surface of the dielectric material layer.

DETAILED DESCRIPTION

Figure 1:
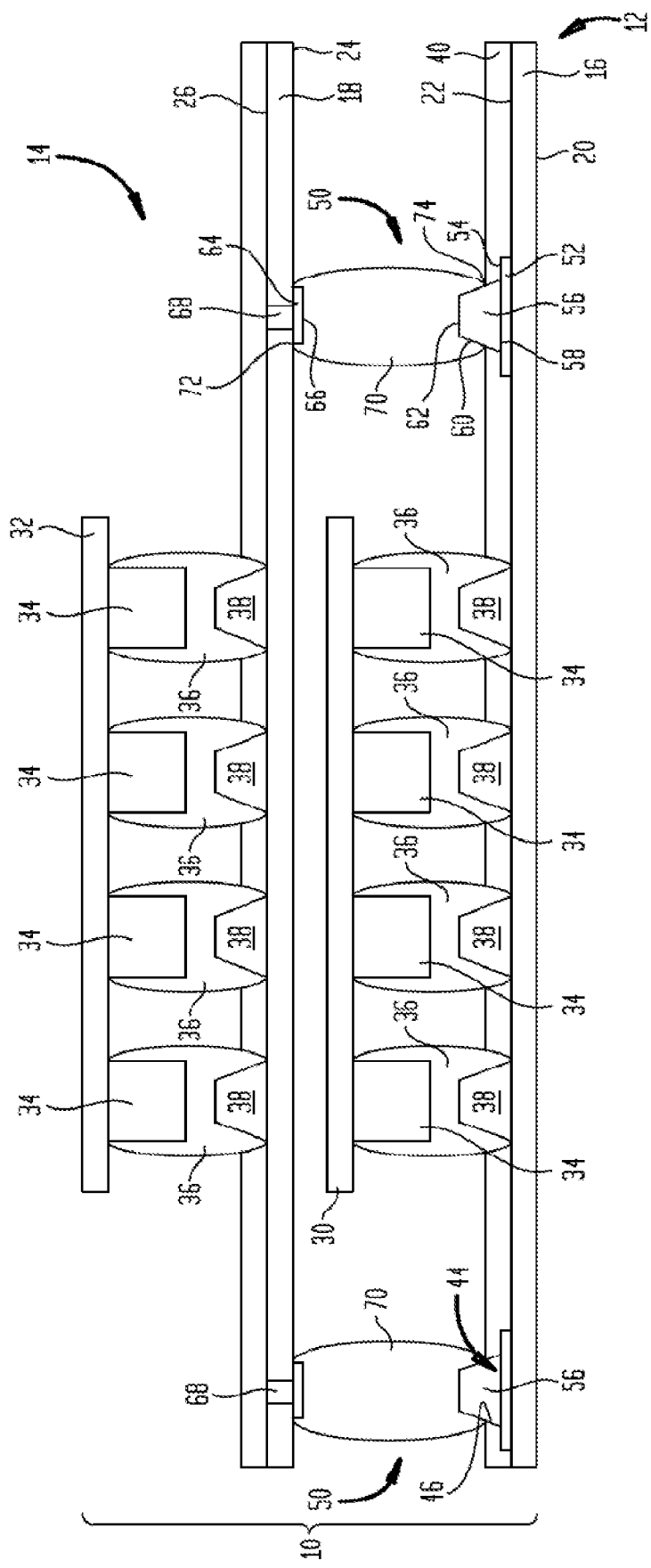
FIG. 1 shows a stacked assembly of packaged microelectronic elements including an interconnect structure according to an embodiment of the present invention.
Figure 2:
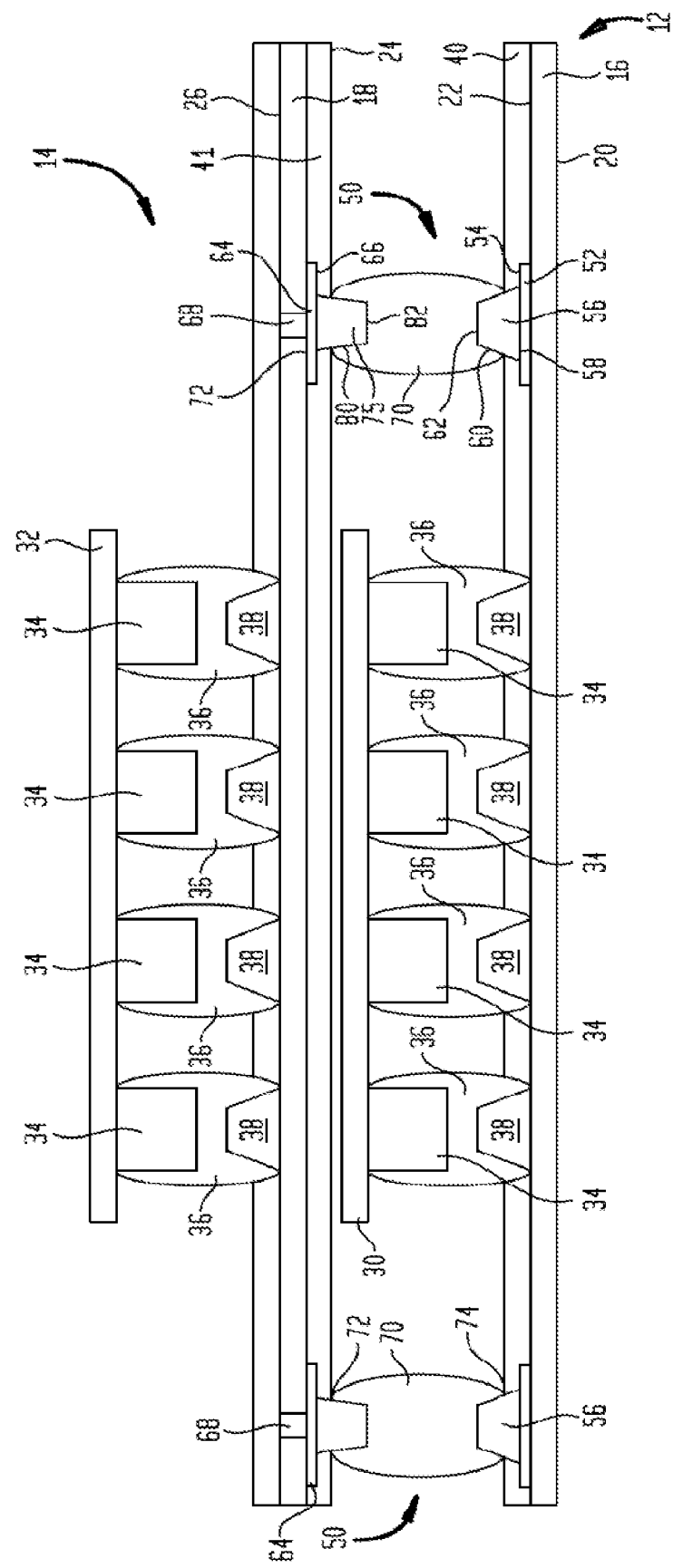
FIG. 2 shows a stacked assembly of packaged microelectronic elements including an interconnect structure according to another embodiment of the present invention.

Turning now to the figures, where like numeric references are used for similar features, FIGS. 1 and 2 show stacked packages 10 of microelectronic subassemblies 12, 14. The microelectronic subassemblies are electronically and mechanically joined to each other by one or more interconnect structures 50 that include components that will be discussed further herein.

The stacked package 10 of FIG. 1 includes a lower assembly 12 and an upper assembly 14. It is noted that, as used herein, the terms upper and lower, along with any other terms that refer to direction or position such as horizontal or vertical, left or right, and the like, are made with reference to the Figures and to an exemplary mode of use. These terms are used for purposes of clarity in this description and are not limiting, as other positions and orientations would be understood by a person of ordinary skill in the art. Each of the lower 16 and upper 18 substrates have respective lower 20,24 and upper 22,26 surfaces. The upper surfaces 22,26 are generally parallel to their respective lower surfaces 20,24, and all surfaces 20,22,24,26 are generally planar. A thickness for each of the upper 14 and lower 12 substrates is defined between the respective upper 22,26 and lower 20,24 surfaces. This thickness can be substantially equal between upper 14 and lower 12 substrates or can vary. The thickness is generally less than the length and width of the substrates 12,14 by a factor sufficient to give the substrates 12,14 a substantially thin, wafer-like structure and falls within a range that is generally understood by those of ordinary skill in the art.

Each assembly 12,14 also includes a respective microelectronic element 30,32. Microelectronic element 30 is shown affixed to lower substrate 16 by flip-chip bonding, in which microelectronic element 30 is inverted such that its conductive contacts (not shown) face toward upper surface 22. The microelectronic element is then affixed to substrate 16 using conductive projections 34 that extend from its contacts and are bonded using solder masses 36 or another conductive bonding material to second conductive projections 38 formed on substrate 16. Other arrangements are possible for connecting microelectronic element 30 to substrate 16 including face-up mounting, in which the contacts on microelectronic element 30 face away from upper surface 26, adhesive is used to bond microelectronic element 30 to upper surface 26, and wire leads are used to electronically connect the contacts of microelectronic element 30 to conductive features, such as traces or pads, formed on substrate 16. Microelectronic element 32 is shown affixed to substrate 18 in a similar fashion, and can alternatively be attached as described above.

The interconnect structure 50 shown in FIG. 1 includes a conductive pad 52 having a face 54 exposed on upper surface 22 of substrate 16. The term "exposed at", as used herein does not refer to any specific means of attachment for pad 52 onto substrate 16 or any relative position therebetween. Rather, it indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric. Pad 52 can be affixed to substrate 16 by forming pad by deposition or the like directly on surface 22, or it can be embedded within substrate 16 such that face 54 is flush with surface 22 or disposed at a height above or below the surface 22 so long as face 54 remains exposed on surface 22. In alternative embodiments, interconnect structure 50 can include a conductive trace or a portion of a conductive trace in addition to or substitution for a conductive pad 52.

A conductive pillar 56 is formed over a portion of face 54 of conductive pad 52. As can be seen in FIG. 1, the base 58 of pillar 56 covers a portion of face 54 and leaves another portion thereof, extending from the periphery of base 58, exposed on surface 22. Pillar 56 also defines an edge surface 60 extending away from base 58 to end 62 of pillar 56. Although a conductive pillar is shown in FIG. 1, alternative structures forming a conductive projection can be used, including a pin, a post or the like, as would be understood by a person of ordinary skill in the art.

Interconnect structure 50 further includes a contact pad 64 having a face 66 exposed on lower surface 24 of substrate 18. As with contact pad 52, pad 64 can be embedded in substrate 18 such that face 66 is flush with, above or beneath lower surface 24 so long as face 66 remains exposed thereon. Pad 64 can be connected to conductive features, such as traces or wires, formed on upper surface 26 of substrate 18 using a conductive via 68 formed through substrate 18. In an alternative embodiment, interconnect structure 50 can include a trace or a part of a trace exposed on lower surface 24 in place of pad 64.

A solder mass 70 is used to mechanically and electronically bond pillar 56 to pad 64. During formation and assembly of package 10 solder mass 70 can be formed initially on either pillar 56 or pad 64 and then reflowed when the assemblies 12, 14 are aligned together to allow solder mass 70 to affix to the other of pillar 56 or pad 64. Once in place in package 10, solder mass 70 forms an upper edge 72 and a lower edge 74. Each of upper edge 72 and lower edge 74 can form into a single line or point or a surface. As shown in FIG. 1, upper edge 72 is a surface that extends along a portion of surface 24 surrounding pad 64. Upper edge 72 can also form a surface that contacts pad 64 or a circular line that surrounds pad either in contact with surface 24 or remote therefrom, depending on the geometry of pad 64.

The structures and techniques disclosed herein can help reduce electromigration at an interface between pads and a solder mass connecting the pads. Electromigration can pose problems in areas where two or more metallic elements that are in contact with each other exhibit different diffusion rates. In such case, voids formation can occur in the bonding interface. That is, one metal can pull away from the other, forming a gap or opening therebetween.

The use of pillar 56, or another conductive projection, in interconnect structure 50 reduces the distance between the end 62 of pillar 56 and pad 64 along a line of electronic current traveling therebetween when compared to a structure including a solder mass connecting two opposite pads. Accordingly, the structure of FIG. 1, in which pillar 56 and pad 64 are both formed from copper, has been shown to be effective in reducing electromigration leading to void formation in a copper-solder-copper interconnect structure. When like metals are used in an electronic interconnect structure in which they are separated by a second metal, an inner-metallic compound, including the like metal, forms within the second metal. This inner-metallic compound will extend from one like metal structure toward the other like metal structure. Inner-metallic compound formation is a factor in reducing void formation due to electromigration because inter-metallic compounds have a slower rate of electromigration than solder. By decreasing the like-metal to like-metal distance within the structure, the inter-metallic compound can be formed extending from one like metal structure to the other like metal structure. In the example of FIG. 1, where pad 64 and pillar 56 are formed from copper and solder mass 70 includes tin, the inter-metallic compound can vary in ratio from, for example $Cu_3Sn$ to $Cu_3Sn_5$. Further, the interconnect structures shown herein can reduce the concentration gradient of the like metal throughout the interconnect structure, which has been shown to be a driving factor for reducing electromigration. The concentration gradient within a structure is the rate at which the concentration of, for example, the like metal changes spatially within a structure. The extension of post 56 into solder mass 70 increases the surface area of copper within the structure, which further increases the presence of inter-metallic compounds within the solder mass 70. The extension of this increased amount of inter-metallic compound can lower the rate of change in presence of copper within the structure, further reducing electromigration.

Figure 3:
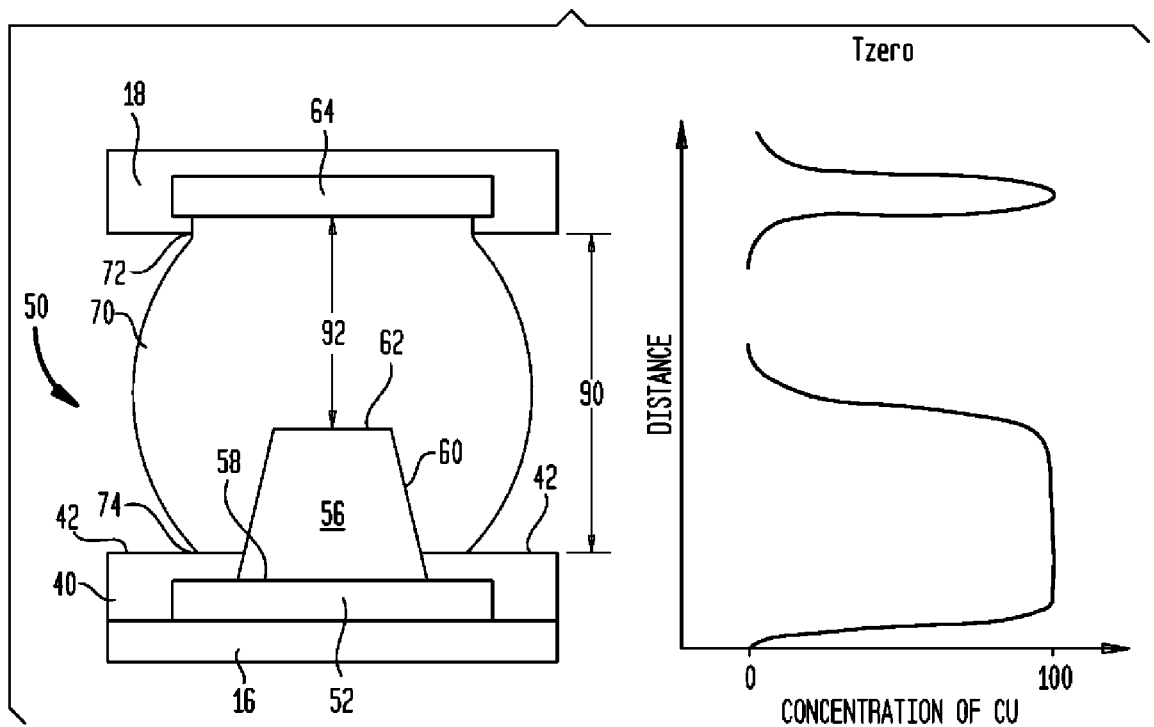
FIG. 3 shows a chart illustrating characteristics of an interconnect structure according to the embodiment of FIG. 1 under a first condition.
Figure 4:
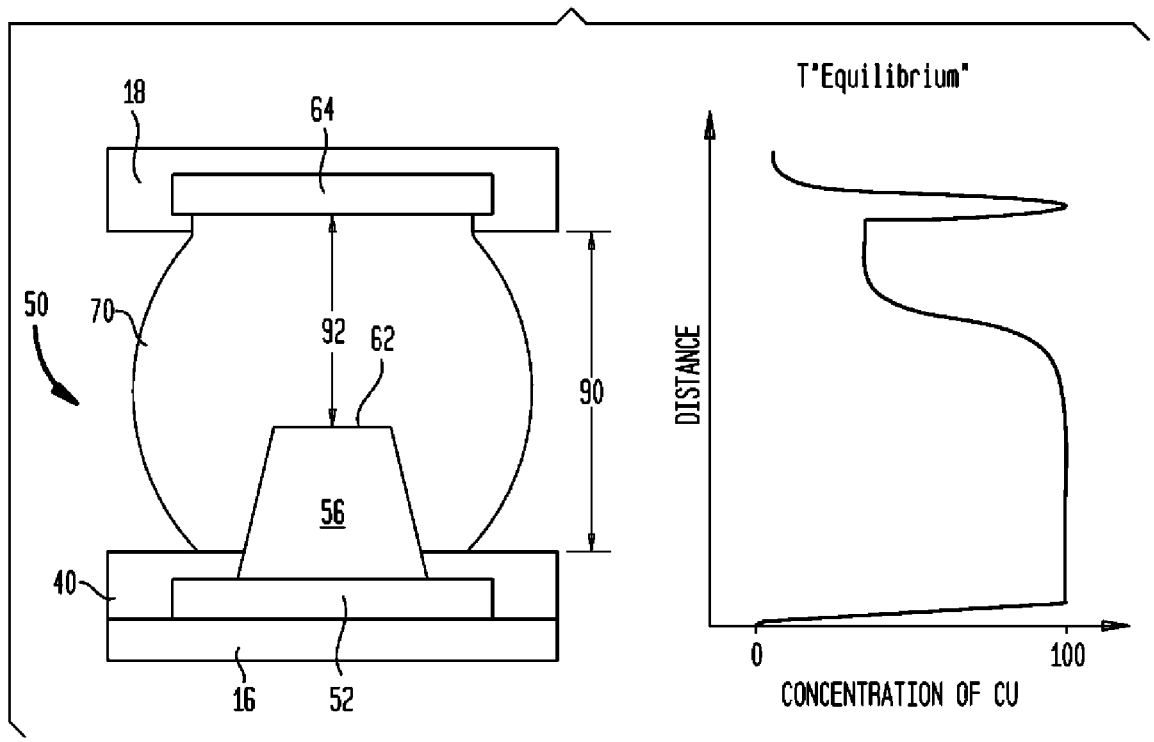
FIG. 4 shows a chart illustrating characteristics of an interconnect structure according to the embodiment of FIG. 1 under a second condition.

The graphs shown in FIGS. 3-6 illustrate the phenomenon described above. FIGS. 3 and 4 show the varying concentration of copper at a horizontal location in an interconnect structure similar to that of FIG. 1 throughout its vertical distance. The graph shown corresponds to an interconnect structure 50 in which pads 52,64 and pillar 56 are made from copper and solder mass 70 is made from a solder compound containing tin. FIG. 3 shows the concentration of copper when the structure is at a temperature ($T_0$) that occurs in absence of a current passing therethrough, which indicates an absence of copper within solder mass 70 under that temperature condition. FIG. 4 shows the concentration of copper throughout the same structure at an equilibrium temperature of the structure in presence of an electronic current. The graph of FIG. 4 shows the presence of a copper concentration within the solder mass 70 that is present due to inter-metallic compound formation. The inter-metallic compound is shown to extend from end 62 of pillar 56 to face 54 of pad 52. The concentration of copper along both the end and the face 54 also shows a substantial lack of void formation therealong. Further, the graph of FIG. 4 shows that the presence of pillar 56 can lower the rate of change in concentration of copper through the interconnect 50. The line representing concentration of copper changes direction abruptly, for example, in the area immediately within solder mass 70 just adjacent pad 64. Conversely, the change in direction of the line representing concentration of copper is much less drastic in the area of solder mass 70 adjacent pillar 56. It is noted that the graphs are merely exemplary of and, while illustrative of the behavior discussed herein, may not be to scale or exactly representative of the behavior of the specific structures shown in the Figures.

Figure 5:
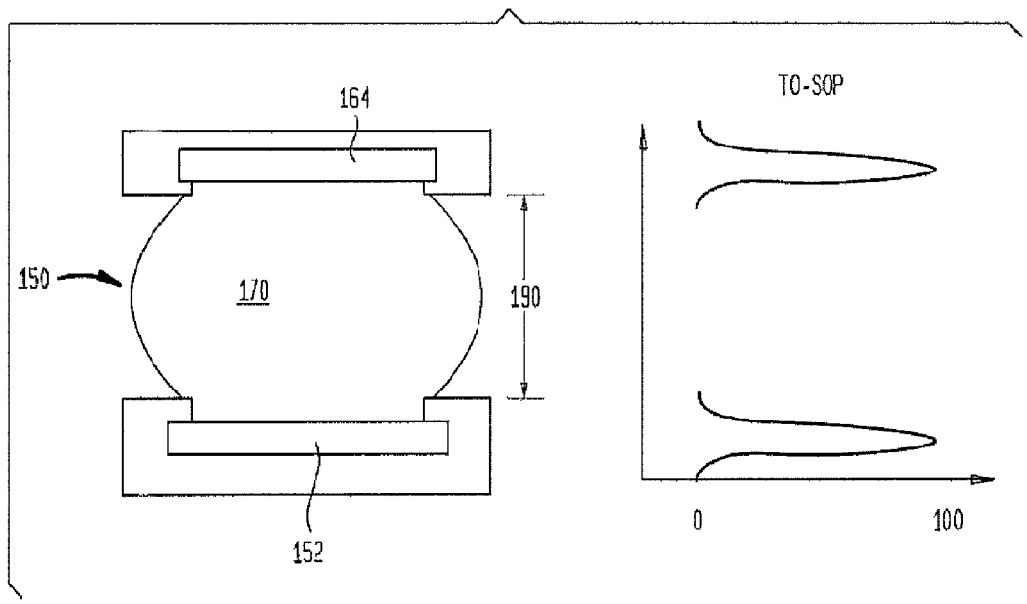
FIG. 5 shows a chart illustrating characteristics of a prior-art interconnect structure under a first condition.
Figure 6:
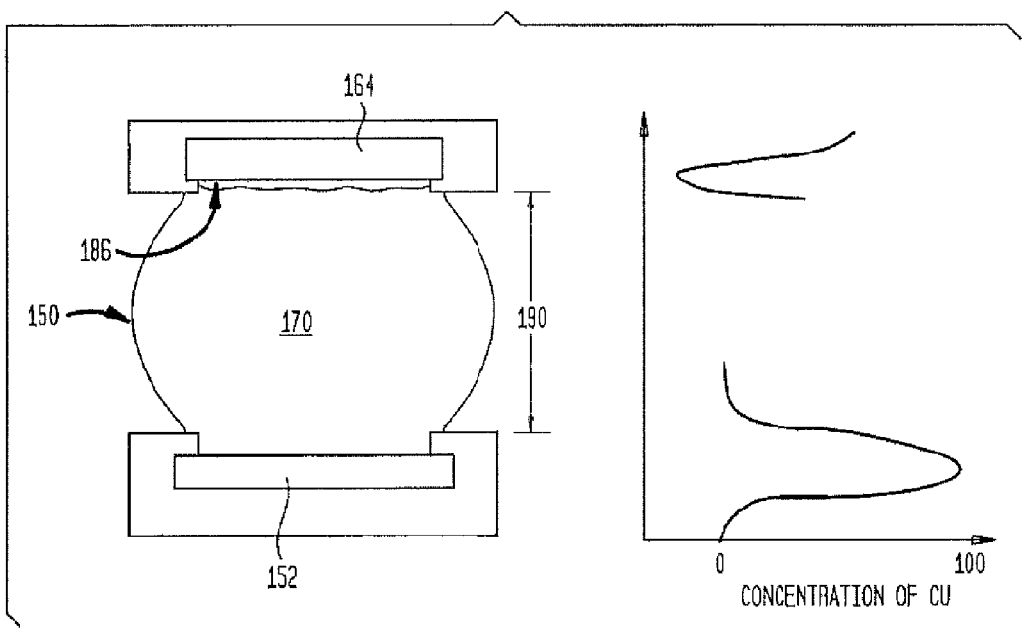
FIG. 6 shows a chart illustrating characteristics of the prior-art interconnect structure of FIG. 5 under a second condition.

The graphs shown in FIGS. 5 and 6 show the concentration of copper through a prior interconnect structure 150 having a solder mass 170 disposed between two contact pads 152 and 164, in which the distance 190 between the pads 152,164 is substantially the same as the distance 90 between the pads 52,64 of FIGS. 3 and 4. FIG. 5 shows the concentration of copper within the structure at $T_o$, indicating an absence of copper within solder mass 170 at that condition. FIG. 6 shows the concentration of copper within the structure at the equilibrium temperature and shows some copper concentration within solder mass 170 due to inter-metallic compound formation, but the concentration does not extend through solder mass 170. This results in formation of voids 186 resulting in facture.

Accordingly, the presence of a pillar 56 having an end 62 that extends into the solder mass 70 toward a like-metal structure on the other side of the solder mass, such as pad 64 can decrease the likelihood of void formation due to electromigration. This is particularly true in structures that extend through an overall distance 90 that is greater than the distance through which an inter-metallic compound can be expected to extend. In an embodiment where pillar 56 and pad 64 are formed from copper and the solder mass 70 includes tin, the distance 92 between end 62 and face 66 can be between about 10% and 50% of the distance 90. It is noted that while in FIG. 3, distance 90 is defined between lower surface 24 of substrate 18 and outer surface of dielectric layer 40, distance 90 is defined between the major surface of whatever type of structure surrounds pads 52,64.

In an embodiment, lower edge 74 forms a circular line or annular surface around a portion of the edge surface 60 of pillar 56, which extends into solder mass 70. Further, lower edge 74 is spaced apart from pad 52 such that solder mass 70 does not directly contact any portion of pad 52, including the portion that remains exposed around base 58 of pillar 56. A treatment can be applied to pillar 56, specifically to edge surface 60, near base 58 that can prevent solder mass 70 from wicking along edge surface 60 into contact with face 54 or pad 52. Such treatments can include oxidation or the like. Similarly a layer of material can be applied around edge surface 60 that is resistant to solder flow.

In a further embodiment, lower edge 74 of solder mass 70 is held away from face 54 of pad 52 by a dielectric layer 40 that extends over face 54 and into contact with at least a portion of edge surface 68 adjacent to base 58. In this embodiment, solder mass 70 is allowed to flow into contact with dielectric layer 40, including surface 42, such that lower edge 74 can extend therealong in a spaced-apart relationship with pad 52.

Figure 7:
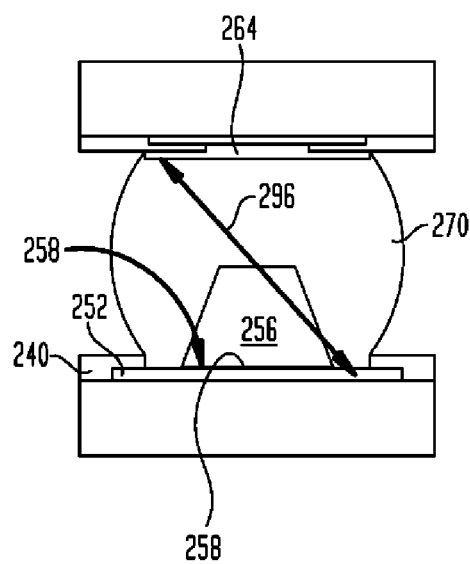
FIG. 7 shows a component of an interconnect structure according to an alternative embodiment.
Figure 8:
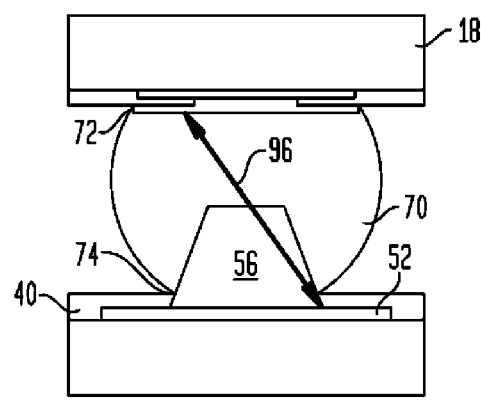
FIG. 8 shows a component of an interconnect structure according to a further alternative embodiment.

By keeping solder mass 70 away from pad 52, the likelihood of void formation due to electromigration can also be reduced. An interconnect structure of this type reduced electromigration by lowering the concentration of electronic current within solder mass 70. As shown in FIGS. 7 and 8, a current traveling through interconnect structure 50 moves diagonally along lines from a point on one end of the structure to a point on the other end of the structure that is substantially laterally opposite the point of origin. This means that current traveling from pad 252 in FIG. 7 will move along a path represented by line 296 that passes through solder mass 270 and back into pillar 256. The current then leaves pillar 256 and re-enters solder mass 270 before reaching pad 264. This path results in a current concentration in the portion of solder mass 270 near base 258 of pillar 256. Current concentration is another driving force behind electromigration that can cause void formation resulting in interconnect failure.

As shown in FIG. 8, by interposing dielectric layer 40 between lower edge 74 of solder mass 70 and the exposed pad 52, no current will travel out of pad 52. Rather the current will travel along a line 96 that only enters solder mass 70 once, shown in the interface between end 62 and solder mass 70. This can reduce the current concentration gradient by a factor of between about 1.25 and 1.75, which can, in turn reduce the likelihood of void formation. A similar path would be observed in a structure wherein solder mass 70 extends outwardly along a portion of dielectric layer 40 so long as solder mass 70 is held away from pad 52 by dielectric layer 40.

Dielectric layer 40 is shown in FIG. 1 as extending along a major portion of upper surface 22 of substrate 16. This portion includes all of upper surface 22 that is not penetrated by other contact elements. Alternatively, dielectric layer 40 can be formed in portions surrounding any pillars 56 used in interconnect structure 50, extending away therefrom through a distance sufficient to keep solder masses away from associated contact pads 52. In such an embodiment dielectric layer portions can be substantially the same size and shape as the contact pads or slightly larger, so as to reliably cover any otherwise exposed portions of the pads.

In an embodiment, dielectric layer 40 has a thickness 42 in the areas covering pads 52 such that the lower end 74 of solder mass 70 is kept spaced apart at a distance therefrom. This distance can include compensation for any tolerance in overall material thickness to ensure that no holes or gaps are present that lead to unintended exposure of face 54 of pad 52. The thickness 42 can be between about 10 μm and 30 μm. In such an embodiment, dielectric layer 40 will have a hole 44 or a plurality of holes 44 through which any interconnect pillars 56 extend. Holes 44 form an inner surface 46 that can contact a portion of edge surface 60 extending upwardly from base 58.

Figure 11:
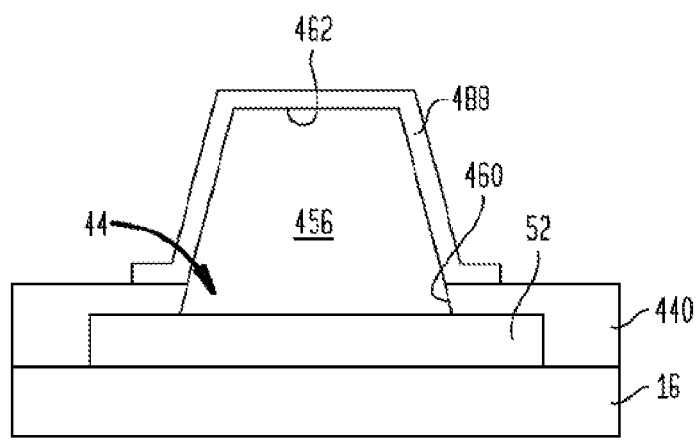
FIG. 11 shows a component of an interconnect structure including a deposited metal layer.
Figure 1:
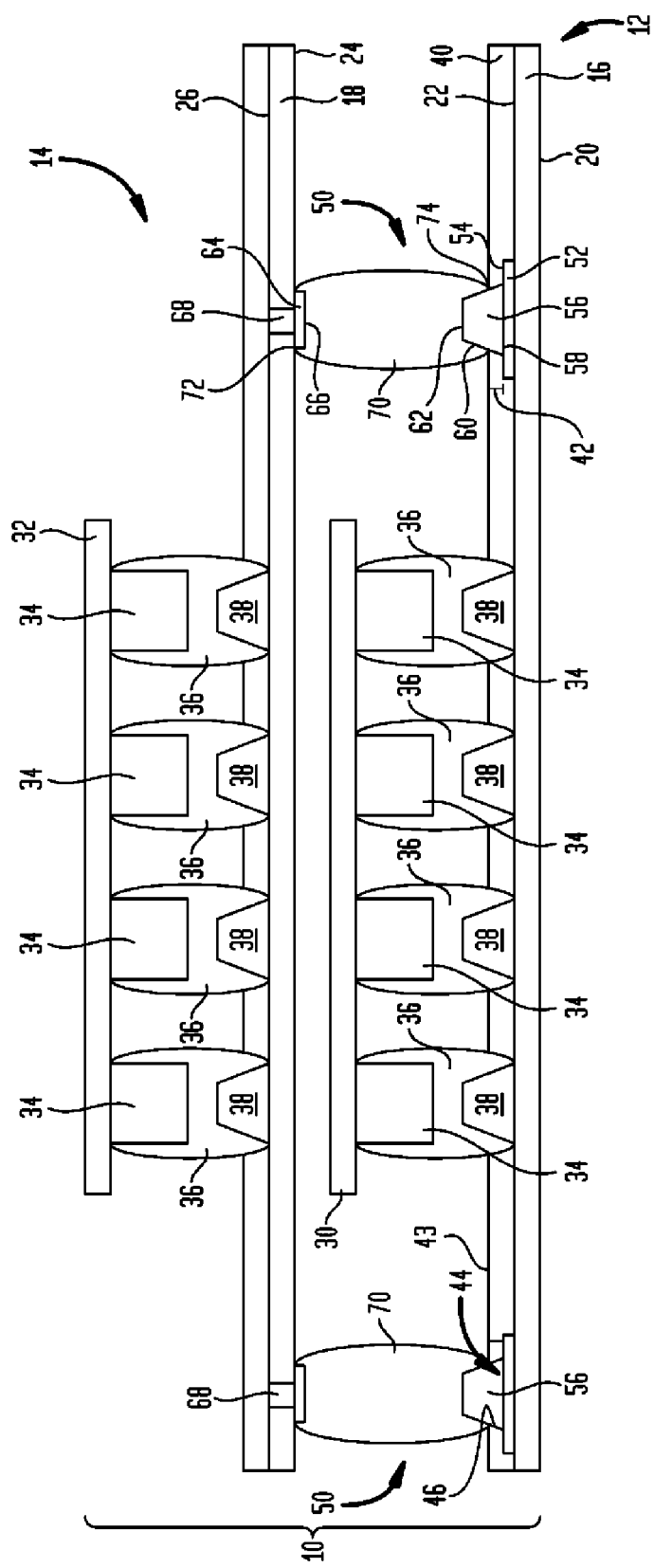
Figure 2:
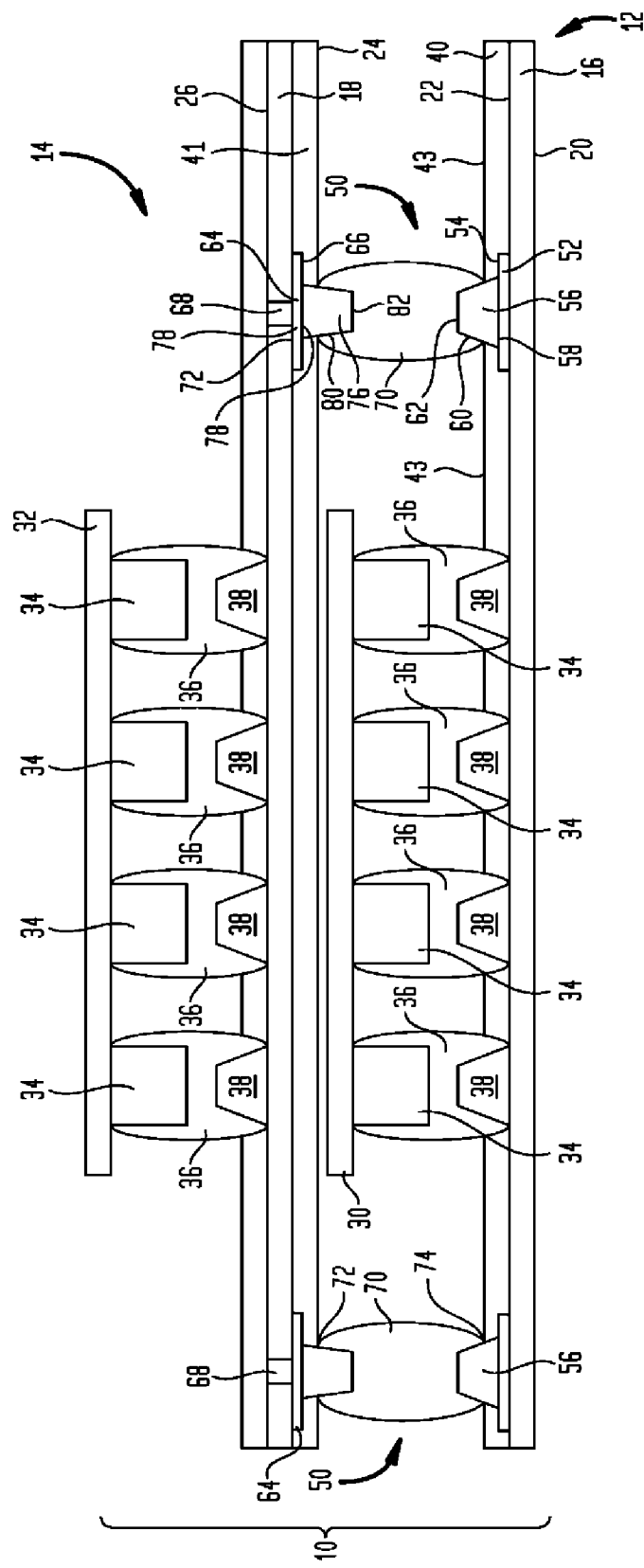

As shown in FIG. 11, a plating layer 488 can be applied over pillar 456 including end 462 and a portion of edge surface 460 exposed over dielectric layer 440. Plating layer 488 can help ensure a reliable interconnection between pillar 456 and a solder mass.

FIG. 2 shows a stacked assembly 10 including a plurality of microelectronic subassemblies 12,14 having interconnect structures 50. The package 10 shown in FIG. 2 is substantially similar to that shown in FIG. 1, except that the interconnect structure 50 in the package 10 of FIG. 2 includes a conductive post 76 extending from face 66 of pad 64. Post includes base 78, affixed on face 66, and an edge surface 80 extending to an end 82 remote from face 66. A second dielectric layer 41 can be formed along lower surface 24 of substrate 18 covering any portion of face 66 and pad 64 exposed outside the periphery of base 78. As with dielectric layer 40, dielectric layer 41 keeps upper edge 72 of solder mass 70 from contacting pad 64, which reduces the current concentration of solder mass 70 near upper edge 72. This further reduces the likelihood of void formation within interconnect structure 50, as described above with respect to dielectric layer 40.

Figure 9:
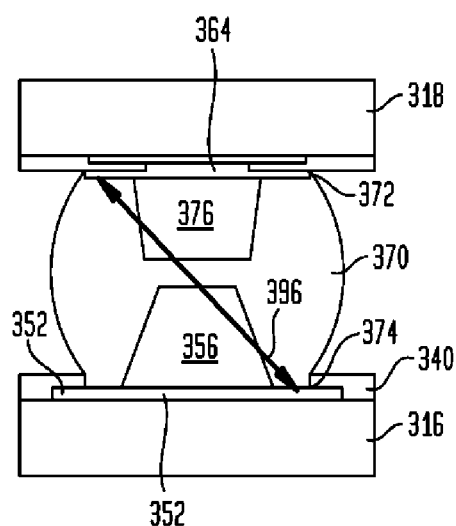
FIG. 9 shows a component of an interconnect structure according to an alternative embodiment.
Figure 10:
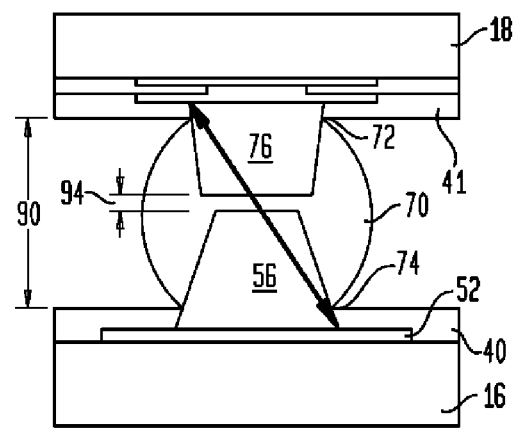
FIG. 10 shows a component of an interconnect structure according to a further alternative.

FIGS. 9 and 10 illustrate the reduction in current concentration within a solder mass included in an interconnect structure that results by keeping the solder mass out of contact with an associated conductive pad. FIG. 9 shows an interconnect structure 350 that includes a pad 352 with a pillar 356 formed thereon. A solder mass 370 attaches pillar 356 and pad 552 to an upper pad 364 and a post 376 formed thereon. Current flow, represented by line 396, passes out of contact pad 352 and into solder mass 370, then passes back into pillar 356 and then back out into solder mass 370. The current flow (line 396) then passes into post 376 before passing back into solder mass 370 and, finally, into pad 364. This current path 396 results in increased current concentration within the solder mass 370 in the area of the upper edge 372 and lower edge 374 of solder mass 570. As shown in FIG. 10, inclusion of dielectric layers 40,41, prevents the current (line 96) from passing through solder mass 70 near the upper 72 or lower 74 edges thereof, reducing the current concentration gradient in each area by a factor of between about 1.25 and 1.75. This can lead to a reduced likelihood of interconnect failure due to void formation in the interface on each end of solder mass 70.

Additionally, the inclusion of post 76 in assembly 14 can further decrease the like-metal to like-metal distance within the interconnect structure 70, as described above with respect to FIG. 1. In the structure of FIG. 2, this distance is represented by the end-to-end distance 94. Distance 94 can lead to formation of an inter-metallic compound that extends from end 62 to end 82 when distance 94 is between about 10% and 30% of distance 90. Post 76 can, alternatively, be any conductive projection, such as a pillar, a pin, or the like. By including conductive projections on both assemblies 12,14, it is possible to achieve a connection that produces a reliable inter-metallic compound while achieving a finer pitch between adjacent interconnect structure 50 than would be possible using a pillar-to-pad arrangement, as shown in FIG. 1, while covering a greater overall distance 90. Further, by forming a dielectric layer 41 over pad 64, a lower current concentration is possible than with simply a pad 64 to which solder mass 70 is formed. By including post 76 in interconnect structure 50, the contribution of concentration gradient to electromigration can also be reduced further. In such a structure, the reduction in the rate of change of copper concentration interconnect 50 in the area of pillar 56 can also be achieved in the area of post 76, thereby removing any abrupt changes in copper concentration at both ends of solder mass 70.

The interconnect structures 50 shown in FIGS. 1 and 2, including dielectric layers 40,41 and their related structures can be used for other connection types beyond the stacked subassembly arrangement shown in FIGS. 1 and 2. For example, they can be used in flip-chip bonding (such as shown between microelectronic element 30 and substrate 16 in FIGS. 1 and 2), and in connecting a microelectronic subassembly, such as microelectronic subassembly 12, to another substrate, either in face-up or flip-chip bonding. Further, an assembly such as assembly 14 can further include an additional contact pad on upper surface 26 of substrate 18 having a pillar and dielectric layer formed thereon in the manner of pillar 56 and dielectric layer 40 to connect to an additional microelectronic assembly using an interconnect structure such as that shown in FIG. 1 or 2. This arrangement can be continued to attach further assemblies within a stacked package.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

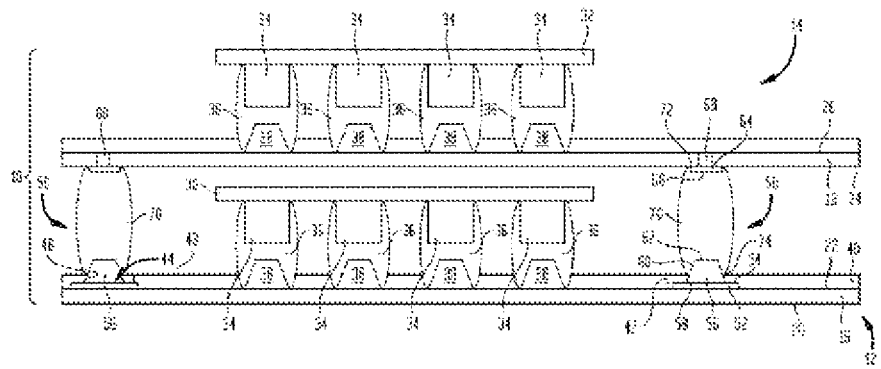

The invention claimed is:

1. A microelectronic assembly comprising:
   a first surface;
   a first thin conductive element exposed on the first surface and having a first face consisting of first and second regions;
   a first conductive projection having a base connected to and covering the first region of the first face and extending to an end remote therefrom, an edge surface extending between the base and the end, and a first barrier formed along a portion thereof, the first barrier having a first edge remote from the first thin conductive element;
   a second surface having a second face;
   a second thin conductive element on the second surface,
   a second conductive projection having a base overlying the second surface, the second conductive projection extending away from the second thin conductive element to an end remote therefrom and having an edge surface extending between the base of the second conductive projection and the end of the second conductive projection, wherein the second conductive projection includes a second barrier layer formed along the edge surface of the second conductive projection adjacent the base, the second barrier having a second edge remote from the second thin conductive element; and
   a first fusible metal mass connecting the first conductive projection to the second conductive projection such that the first face is oriented toward the second surface, wherein the first fusible metal mass extends along the edge surface of the first conductive projection to a location toward the first edge of the first barrier, the first barrier being disposed between the first thin conductive element and the first fusible metal mass, wherein the first fusible metal mass extends along the edge surfaces of the first and second conductive projections from the edge of the first barrier to the edge of the second barrier.

2. The microelectronic assembly of claim 1, wherein the barrier is a surface-treatment layer formed on the first conductive projection.

3. The microelectronic assembly of claim 1, wherein the surface-treatment layer is formed by oxidation.

4. The microelectronic assembly of claim 1, wherein the surface-treatment layer is a coating applied on a surface of the first conductive projection.

5. The microelectronic assembly of claim 1, wherein a layer of dielectric material covers the second region of the first thin conductive element.

6. The microelectronic assembly of claim 1, wherein portions of the first fusible metal mass extend along the edges of the first and second conductive projections.

7. The microelectronic assembly of claim 1, wherein the second surface is a substrate.

8. The microelectronic assembly of claim 1, wherein the second barrier is a dielectric layer.

9. The microelectronic assembly of claim 1, wherein the second conductive projection is one of a pillar or a pin.

10. The microelectronic assembly of claim 1, wherein first conductive projection and the second conductive projection are comprised of copper, and the first fusible metal mass is comprised of solder.

11. A microelectronic assembly, comprising:
a first subassembly including:
- a first substrate having a first surface;
- a plurality of first conductive pads, each having a first face exposed on the first surface;
- a plurality of first projections, each defining a base having a periphery and connected to a respective one of the first conductive pads, the first projections extending away from the respective first conductive pads toward respective ends of the first projections, wherein exposed portions of the first faces of the conductive pads are defined outside of peripheries of the bases of the first projections; and
- a first dielectric material layer overlying the exposed portions of the faces of the first conductive pads, and defining a plurality of openings through which respective ones of the first projections pass, the first dielectric material layer contacting at least the peripheries of the first projections and spaced away from the ends of the first projections so as to definine a first outer surface;

a second subassembly including:
- a second substrate having a second face;
- a plurality of second conductive pads exposed on the second face; and
- a plurality of second projections, each of the plurality of second projections having a base connected to a respective one of the second conductive pads and extending away from the respective second conductive pads toward respective ends of the plurality of second projections, and
- a second dielectric material layer overlying exposed portions of the second conductive pads and having a first outer surface, the first outer surfaces of the second projections being spaced away from the ends of the second projections, the exposed portions of the second conductive pads being defined outside of peripheries of the bases of the second projections; and a plurality of fusible metal masses respectively joining the plurality of first projections to respective ones of the plurality of second projections such that the second face of the second substrate is oriented toward the first surface of the first substrate, wherein the fusible metal masses cover at least portions of the first projections extending to the first outer surface of the first dielectric material layer and at least portions of the second projections extending to the first outer surface of the second dielectric material layer.

12. The microelectronic assembly of claim 11, wherein the plurality of first conductive pads are comprised of copper and the fusible metal masses are comprised of copper.

13. The microelectronic assembly of claim 11, wherein the plurality of second conductive projections are one of a pillar or a pin.

14. The microelectronic assembly of claim 11, wherein the assembly further comprises a microelectronic element positioned between the first and second substrates, the microelectronic assembly having a plurality of third projections extending away from the microelectronic element, the third projections electrically connected with the first and second projections.

15. The microelectronic assembly of claim 11, wherein the assembly further comprises a microelectronic element overlying the first and second substrates, the microelectronic element further including a plurality of third projections extending away therefrom and electrically connected with the first and second projections.

16. A microelectronic assembly comprising:
- a first substrate having a first surface;
- a first thin conductive element exposed on the first surface and having a first face;
- a first conductive projection having a base connected to the first face and extending to an end remote from the first face, a side wall being defined between the base and the end;
- a dielectric material layer having a second surface and a third surface remote from the second surface, the second surface extending along the first surface of the first substrate, the dielectric material layer having a first opening defining a periphery formed therein;
- a metal plating layer having a first portion extending along the end and at least a portion of the side wall of the first conductive projection and a second portion extending outwardly along a portion of the dielectric material layer and away from the first conductive projection; and
- a first solder mass formed over at least the first portion of the metal plating layer and extending toward the third surface.

17. The microelectronic assembly of claim 16, wherein the first conductive projection is one of a pillar or a pin.

* * * * *

UNITED STATES PATENT AND TRADEMARK OFFICE
CERTIFICATE OF CORRECTION

PATENT NO. : 9,496,236 B2  
APPLICATION NO. : 14/501915  
DATED : November 15, 2016  
INVENTOR(S) : Debabrata Gupta et al.

It is certified that error appears in the above-identified patent and that said Letters Patent is hereby corrected as shown below:

On the Title Page  
Delete the title page and substitute therefore with the attached title page consisting of the corrected illustrative figure.

In the Drawings  
Please replace Drawing sheets 1-3 and 5 containing FIGS. 1-4 and FIGS. 7-10 with Drawing sheets 1-3 and 5 containing FIGS. 1-4 and FIGS. 7-10 as shown on the attached pages.

In the Specification  
Column 4, Line 48, "upper 14 and lower 12" should read -- upper 18 and lower 16 --.  
Column 4, Line 51, "upper 14 and lower 12" should read -- upper 18 and lower 16 --.  
Column 4, Line 53, "substrates 12,14" should read -- substrates 16,18 --.  
Column 4, Line 53-54, "substrates 12,14" should read -- substrates 16,18 --.  
Column 7, Line 55, "edge surface 68" should read -- edge surface 60 --.  
Column 7, Line 57, "surface 42" should read -- surface 43 --.  
Column 9, Line 7, "pad 552" should read -- pad 352 --.  
Column 9, Line 15, "solder mass 570" should read -- solder mass 370 --.  
Column 9, Line 25, "structure 70" should read -- structure 50 --.

In the Claims  
Column 10, Line 47, "claim 1" should read -- claim 2 --.  
Column 10, Line 49, "claim 1" should read -- claim 2 --.  
Column 11, Line 20, "definine" should read -- define --.  
Column 12, Line 7, "second conductive projections" should read -- second projections --.

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*

(12) United States Patent
Gupta et al.

(10) Patent No.: US 9,496,236 B2
(45) Date of Patent: Nov. 15, 2016

(54) INTERCONNECT STRUCTURE

(71) Applicant: Tessera, Inc., San Jose, CA (US)

(72) Inventors: Debabrata Gupta, Scottsdale, AZ (US); Yukio Hashimoto, Hitachinaka (JP); Ilyas Mohammed, Santa Clara, CA (US); Laura Wills Mirkarimi, Sunol, CA (US); Rajesh Katkar, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/501,915

(22) Filed: Sep. 30, 2014

(65) Prior Publication Data

US 2015/0014850 A1 Jan. 15, 2015

Related U.S. Application Data

(62) Division of application No. 12/965,192, filed on Dec. 10, 2010, now Pat. No. 8,853,558.

(51) Int. Cl.
*H05K 1/16* (2006.01)
*H01L 23/00* (2006.01)
(Continued)

(52) U.S. Cl.
CPC ......... *H01L 24/14* (2013.01); *H01L 23/49811* (2013.01); *H01L 23/528* (2013.01); *H01L 25/105* (2013.01); *H01L 23/49833* (2013.01);
(Continued)

(58) Field of Classification Search
CPC ............ H01L 24/14; H01L 23/49811; H01L 25/105; H01L 23/528; H01L 23/49833; H01L 24/81; H01L 2224/81193; H01L 2224/81801

USPC .................................................. 174/260
See application file for complete search history.

(56) References Cited

U.S. PATENT DOCUMENTS

| 3,214,827 A | 11/1965 | Phohofsky |
| 3,766,439 A | 10/1973 | Isaacson |

(Continued)

FOREIGN PATENT DOCUMENTS

| CN | 1244037 | 2/2000 |
| DE | 102006006825 A1 | 8/2007 |

(Continued)

OTHER PUBLICATIONS

U.S. Appl. No. 12/965,172, filed Dec. 10, 2010.
(Continued)

*Primary Examiner* — Tremesha S Willis
(74) *Attorney, Agent, or Firm* — Lerner, David, Littenberg, Krumholz & Mentlik, LLP

(57) ABSTRACT

A microelectronic assembly includes first and second surfaces, a first thin conductive element, a first conductive projection, and a first fusible mass. The first thin conductive element includes a face that has first and second regions. The first conductive projection covers the first region of the first face. A barrier may be formed along a portion of the first region. The second face includes a second conductive projection that extends away therefrom. The first fusible metal mass connects the first conductive projection to the second conductive projection such that the first surface of the first face is oriented toward the second surface of the second substrate. The first mass extends along a portion of the first conductive projection to a location toward the first edge of the barrier. The barrier is disposed between the first thin element and the first metal mass.

17 Claims, 6 Drawing Sheets